United States Patent [19]

Rajkanan et al.

[11] Patent Number: 5,750,426
[45] Date of Patent: May 12, 1998

[54] METHOD OF MAKING MOS PRECISION CAPACITOR WITH LOW VOLTAGE COEFFICIENT

[75] Inventors: Kamal Rajkanan, Fremont; Bruno Kranzen, San Jose, both of Calif.

[73] Assignee: Zilog, Inc., Campbell, Calif.

[21] Appl. No.: 738,984

[22] Filed: Nov. 24, 1996

Related U.S. Application Data

[62] Division of Ser. No. 407,486, Mar. 16, 1995, Pat. No. 5,608,258.

[51] Int. Cl.$^6$ ................................................ H01L 21/8242
[52] U.S. Cl. ................................................ 438/210; 438/241
[58] Field of Search ................................................ 438/210, 241, 438/250, 251, 253

[56] References Cited

U.S. PATENT DOCUMENTS

| 5,017,507 | 5/1991 | Miyazawa | 438/210 |
| 5,055,905 | 10/1991 | Anmo | 257/532 |
| 5,136,357 | 8/1992 | Hesson et al. | 257/532 |
| 5,264,723 | 11/1993 | Strauss | 257/532 |
| 5,266,821 | 11/1993 | Chern et al. | 257/532 |
| 5,286,666 | 2/1994 | Katto et al. | 438/241 |
| 5,320,976 | 6/1994 | Chin et al. | 438/241 |
| 5,360,989 | 11/1994 | Endo | 257/532 |

FOREIGN PATENT DOCUMENTS

| 61-048957 | 3/1986 | Japan . |
| 61-272963 | 12/1986 | Japan . |
| 1146351 | 6/1989 | Japan . |

*Primary Examiner*—Chandra Chaudhari
*Attorney, Agent, or Firm*—Majestic, Parsons, Siebert & Hsue

[57] ABSTRACT

A MOS precision capacitor is formed in an integrated circuit including a p-mos and n-mos transistor without adding to the process steps used in forming the p-mos and n-mos transistor. The MOS precision capacitor includes a n-well formed concurrently with a n-well of the p-mos transistor, a n-type region formed concurrently with a threshold adjust region of the p-mos transistor, an oxide layer formed concurrently with gate oxide layers of the p-mos and n-mos transistors, a first electrode formed over the n-type region, at least one n+ region formed concurrently with source and drain regions of the n-mos transistor by self aligning to the sidewall of the first electrode, and a second electrode connected to the at least one n+ region. Good gate oxide tracking between the MOS precision capacitor, the p-mos transistor, and the n-mos transistor, is provided by forming the n-type region of the MOS precision capacitor with a dopant concentration approximately equal to that of the threshold adjust region of the p-mos transistor, and approximately within an order of magnitude of that of the n-mos transistor. Good ground isolation for the MOS precision capacitor is provided by forming the MOS precision capacitor in its own n-well. Low voltage and signal frequency dependency for the MOS precision capacitor is provided by respectively forming the n-type and n+ regions between the first and second electrodes of the MOS precision capacitor such that their respective dopant concentrations are greater than that of the n-well.

11 Claims, 8 Drawing Sheets

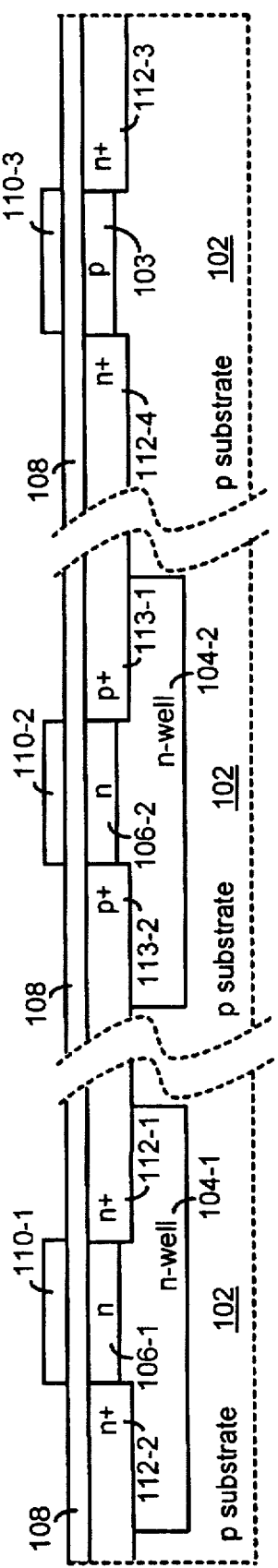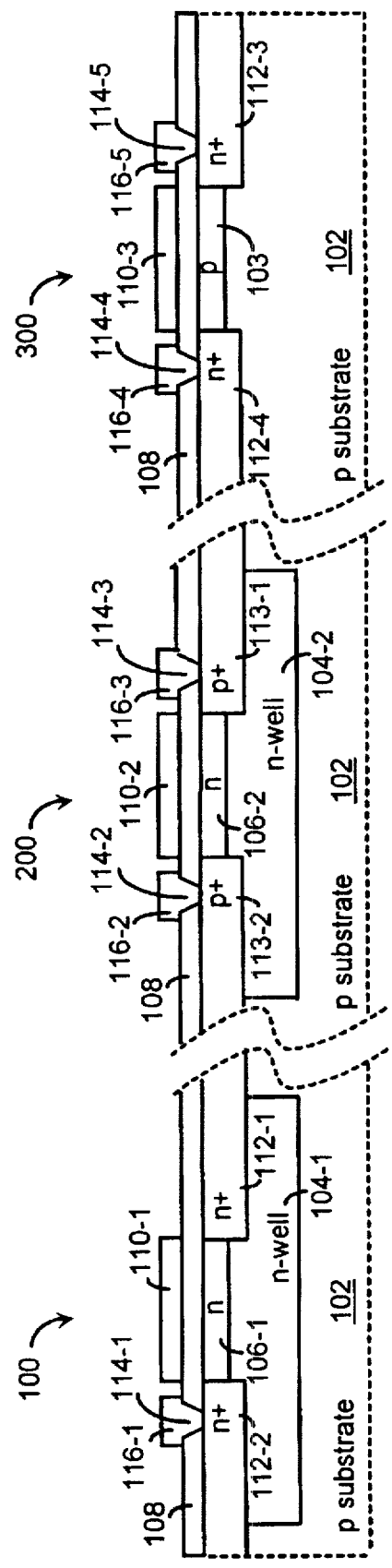

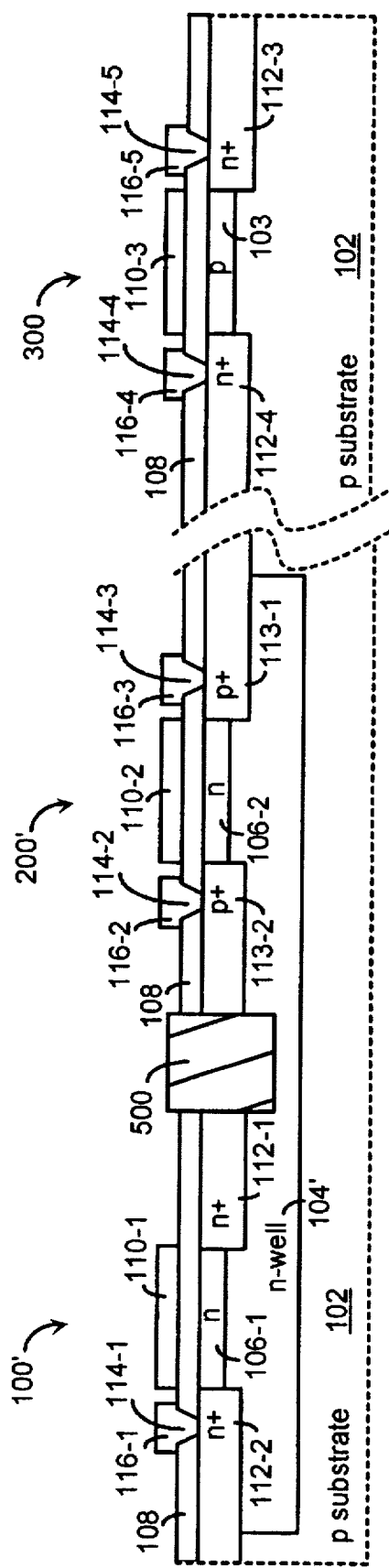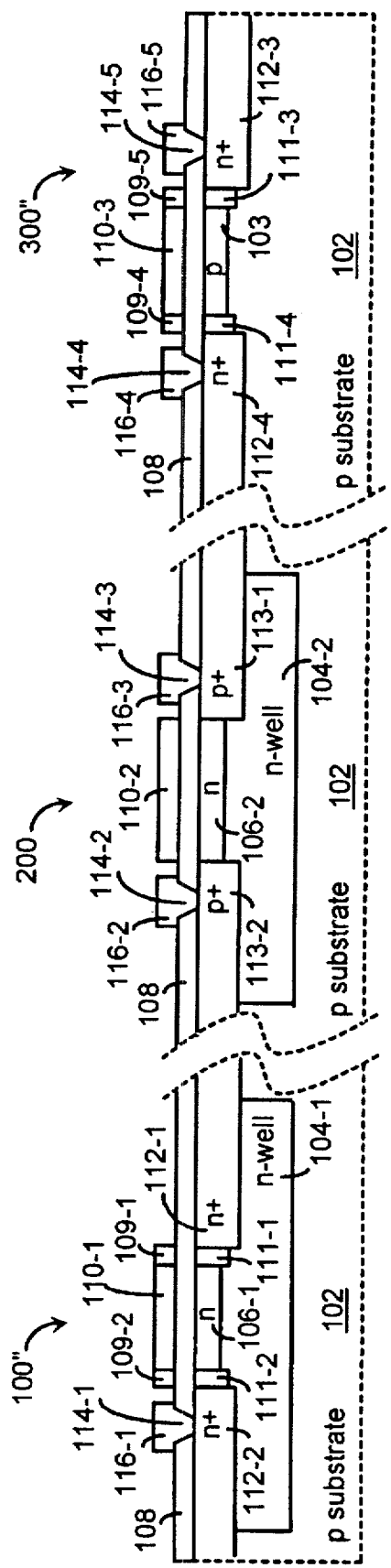
fig.5
fig.6

METHOD OF MAKING MOS PRECISION CAPACITOR WITH LOW VOLTAGE COEFFICIENT

This is a division of application Ser. No. 08/407,486 and now U.S. Pat. No. 5,608,258 filed Mar. 16, 1995.

BACKGROUND OF THE INVENTION

This invention relates in general to MOS capacitors and in particular, to MOS precision capacitors with low voltage coefficients and techniques for forming such MOS precision capacitors.

FIGS. 1-3 illustrate, as examples, three prior art MOS capacitor structures. In FIG. 1, a basic MOS capacitor 10 includes a p substrate 12 biased to a low reference voltage such as ground, an oxide layer 16 having a thickness "tox", a first electrode 14 isolated from the p substrate 12 by the oxide layer 16 formed over the p substrate 12, and a second electrode 15 connected to the p substrate 12 through a via 17. By applying a negative voltage to the first electrode 14, holes attracted towards the first electrode 14 form an accumulation layer 18 near the surface of the p substrate 12. The accumulation layer 18 thereupon acts as one plate of a parallel plate capacitor, the first electrode 14 acts as the other plate, and the oxide layer 16 acts as the dielectric medium.

In FIGS. 2 and 3, MOS capacitors 20 and 30 are respectively illustrated. Each of these capacitors has a lower voltage dependency than the MOS capacitor 10. In FIG. 2, the MOS capacitor 20 includes a p substrate 22 biased to a low reference voltage such as ground, a p region 23 formed in and having a higher dopant concentration than the p substrate 22, an oxide layer 26 formed over the p region 23 and the p substrate 22, a first electrode 24 formed above and isolated from the p region 23 by the oxide layer 26, and a second electrode 25 connected to the p substrate 22 through a via 27. In FIG. 3, a conventional n-mos transistor is connected as a capacitor to form the MOS capacitor 30. The MOS capacitor 30 includes a p substrate 32 biased to a low reference voltage such as ground, a threshold adjust region 39 formed in and having a higher dopant concentration than the p substrate 32, an oxide layer 36 formed over the p substrate 32, a first electrode 34 formed over the oxide layer 36 and the threshold adjust region 39, n+ regions 33 and 38 formed in the p substrate 32 and self aligned to the first electrode 34, and a second electrode 35 connected to the n+ region 33 through a via 37. The type of dopant used in forming the threshold adjust region 39 depends upon whether the n-mos transistor is an enhancement mode or depletion mode type. For an enhancement mode n-mos transistor, a p-type dopant is generally used, and for a depletion mode n-mos transistor, a n-type dopant is generally used in forming the threshold adjust region 39. In the MOS capacitors 20 and 30, the higher dopant concentrations (relative to the p substrate) in the p region 23 and the threshold adjust region 39 increase the minimum capacitances $C_{min}$ of their respective MOS capacitors, thereby reducing their voltage dependencies relative to that of the MOS capacitor 10; and in the MOS capacitor 30, n+ regions 33 and 38 reduce the signal frequency dependence of the MOS capacitor 30 relative to that of the MOS capacitor 10.

Typically, such MOS capacitors are formed in an integrated circuit including a plurality of p-mos and/or n-mos transistors. It is generally desirable in forming such an integrated circuit that the capacitances of its MOS capacitors track the capacitances of the plurality of p-mos and/or n-mos transistors. It is also generally desirable in forming such an integrated circuit that the voltages across its MOS capacitors be isolated from "ground bounce" or noise generated by the switching on and off of the plurality of p-mos and/or n-mos transistors. Prior art MOS capacitors are generally deficient in these respects. For additional details on prior art MOS capacitors and their characteristics, see, e.g., Weste, Neil H. E. et. al., *Principles of CMOS VLSI Design*, Addison-Wesley Publishing Company (1985), which details are herein incorporated by this reference.

OBJECTS AND SUMMARY OF THE INVENTION

Accordingly, one object of the present invention is a MOS precision capacitor having improved ground isolation characteristics.

Another object is a MOS precision capacitor having improved tracking characteristics with p-mos and/or n-mos transistors formed in a same integrated circuit as the MOS precision capacitor.

Another object is a MOS precision capacitor having low voltage dependency characteristics.

Another object is a MOS precision capacitor having low signal frequency dependency characteristics.

Still another object is a cost-effective method of forming a MOS precision capacitor having at least the above stated improved characteristics.

These and other objects are accomplished by the various aspects of the present invention, wherein, briefly stated, one aspect is a MOS precision capacitor included with a plurality of n-mos transistors in an integrated circuit formed on a p substrate of a semiconductor wafer. The MOS precision capacitor comprises a n-well formed in the p substrate, an oxide layer formed over the n-well, a first electrode formed over the oxide layer, a first n-type region formed in the n-well by self aligning to the first electrode, and a second electrode connected to the n-type region. For process simplicity as well as good MOS precision capacitor and transistor capacitance tracking, the oxide layer of the MOS precision capacitor is formed concurrently with gate oxide layers of the plurality of n-mos transistors, and the first n-type region of the MOS precision capacitor is formed concurrently with corresponding n-type regions of the plurality of n-mos transistors. The dopant concentration of the first n-type region is greater than the dopant concentration of the n-well.

In a preferred embodiment, the integrated circuit is a CMOS integrated circuit including the MOS precision capacitor, a plurality of p-mos transistors, and a plurality of n-mos transistors. The MOS precision capacitor in this case further includes a second n-type region beneath the first electrode in the n-well. For process simplicity as well as good MOS precision capacitor and transistor capacitance tracking, the n-well of the MOS precision capacitor is formed concurrently with corresponding n-wells of the plurality of p-mos transistors, and the second n-type region is formed concurrently with threshold adjust regions of the plurality of p-mos transistors. The dopant concentration of the second n-type region is greater than that of the n-well of the MOS precision capacitor, and less than that of the first n-type region of the MOS precision capacitor. Where the plurality of n-mos transistors include threshold adjust regions, the dopant concentration of the second n-type region is approximately within an order of magnitude of the dopant concentrations of such threshold adjust regions of the n-mos transistors.

Another aspect of the present invention is a method of forming a MOS precision capacitor in an integrated circuit which does not significantly add to the process complexity of forming the integrated circuit. In particular, when forming a CMOS integrated circuit, the method forms the MOS precision capacitor without adding any additional steps to the process, since it concurrently forms portions of the MOS precision capacitor with corresponding portions of conventional p-mos and n-mos transistors. Briefly stated, a method of forming a MOS precision capacitor in an integrated circuit including a p-mos transistor and a complementary n-mos transistor, wherein the precision capacitor, the p-mos transistor, and the n-mos transistor are respectively formed in first, second, and third regions of a semiconductor wafer including the integrated circuit, comprises: forming, in a same mask step, a n-well in the first region where the precision capacitor is to be formed, and a n-well in the second region where the p-mos transistor is to be formed; forming a gate oxide layer covering the first, second, and third regions of the semiconductor wafer; forming a first electrode of the precision capacitor over the gate oxide layer formed over the n-well formed in the first region of the semiconductor wafer, and forming a gate electrode of the n-mos transistor over the gate oxide layer formed over the third region of the semiconductor wafer; forming, in a same mask step, a first n-type region self aligned to the first electrode of the precision capacitor in the n-well formed in the first region of the semiconductor wafer such that the first n-type region has a dopant concentration greater than the n-well formed in the first region, and a second n-type region self aligned to the gate electrode of the n-mos transistor in the third region of the semiconductor wafer such that the second n-type region has a dopant concentration greater than the n-well formed in the third region; and forming a second electrode of the precision capacitor by connecting the second electrode to the first n-type region self aligned to the first electrode of the precision capacitor.

Additional objects, features, and advantages of the various aspects of the present invention will become apparent from the following description of its preferred embodiment, which description should be taken in conjunction with the accompanying drawings.

BRIEF DESCRIPTION OF THE DRAWINGS

FIGS. 4a–h illustrate, as an example, a method of forming an integrated circuit structure including a MOS precision capacitor utilizing aspects of the present invention;

FIGS. 5–6 respectively illustrate, as examples, integrated circuit structures resulting from alternative methods of forming MOS precision capacitors utilizing aspects of the present invention;

DETAILED DESCRIPTION OF THE PREFERRED EMBODIMENT

FIGS. 4a–h illustrate, as an example, certain steps of a method of forming a MOS precision capacitor 100, a p-mos transistor 200, and a n-mos transistor 300 as parts of a CMOS integrated circuit formed on a p substrate 102 of a semiconductor wafer 1000. To simplify the following description, a number of conventional steps used in forming such devices have been omitted from the figures since they are well known to practitioners of the art and not necessary for understanding the present invention. As an example, the forming of field isolation layers between the devices is not shown or described in FIGS. 4a–h. As another example, the forming of metal interconnect layers and dielectric layers between the metal interconnect layers are not shown or described in FIGS.4a–h. As still other examples, the forming of certain temporary layers such as a sacrificial oxide layer formed prior to the threshold adjust implants and subsequently removed, and numerous photoresist layers used in various masking steps of the method are not shown or described in FIGS. 4a–h. It is to be understood, however, that these and other conventional steps used in forming such devices are contemplated as being included in the method described in reference to FIGS. 4a–h.

In the example depicted in FIGS. 4a–h, it is also to be understood that the MOS precision capacitor 100 is a representative one of a number of such capacitors which may be included in a CMOS integrated circuit, the p-mos transistor 200 is a representative one of a plurality of such transistors included in the CMOS integrated circuit, and the n-mos transistor 300 is also a representative one of a plurality of such transistors included in the CMOS integrated circuit. It is further to be understood that no particular arrangement or organization in the forming of these or other devices on the p substrate 102 of the semiconductor wafer 1000 is to be necessarily suggested by FIGS. 4a–h.

Figure 1:
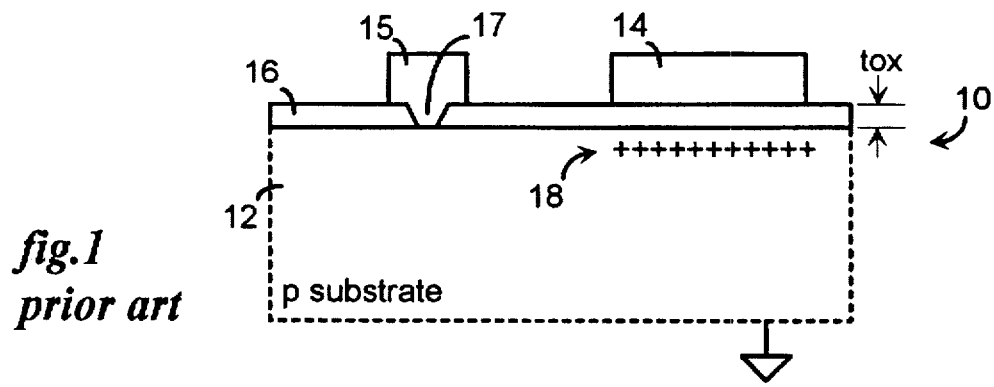
FIGS. 1–3 respectively illustrate, as examples, three prior art MOS capacitors.
Figure 2:
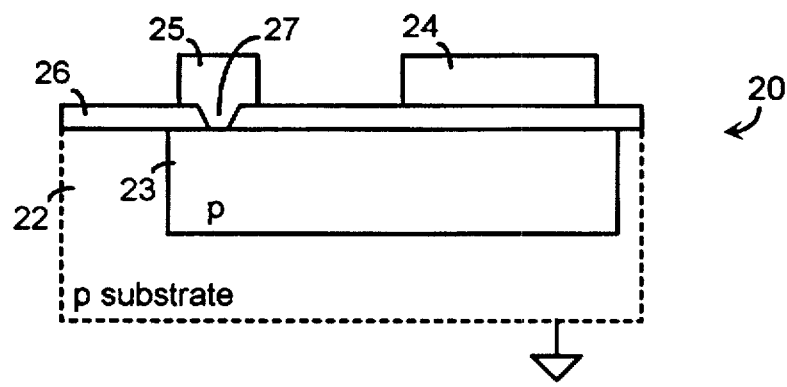
Figure 3:
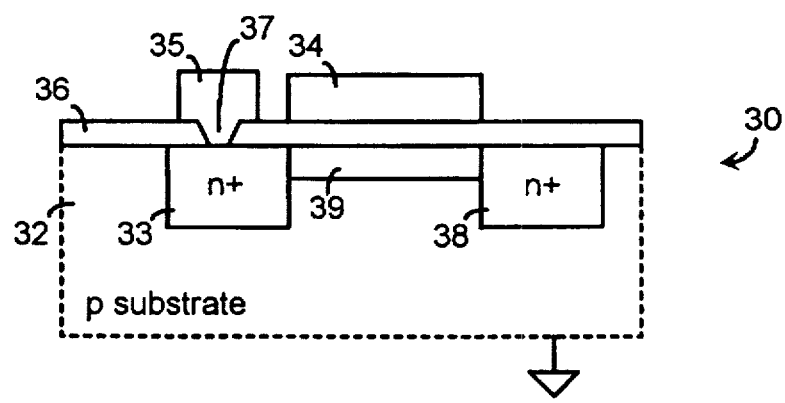
Figure 4A:
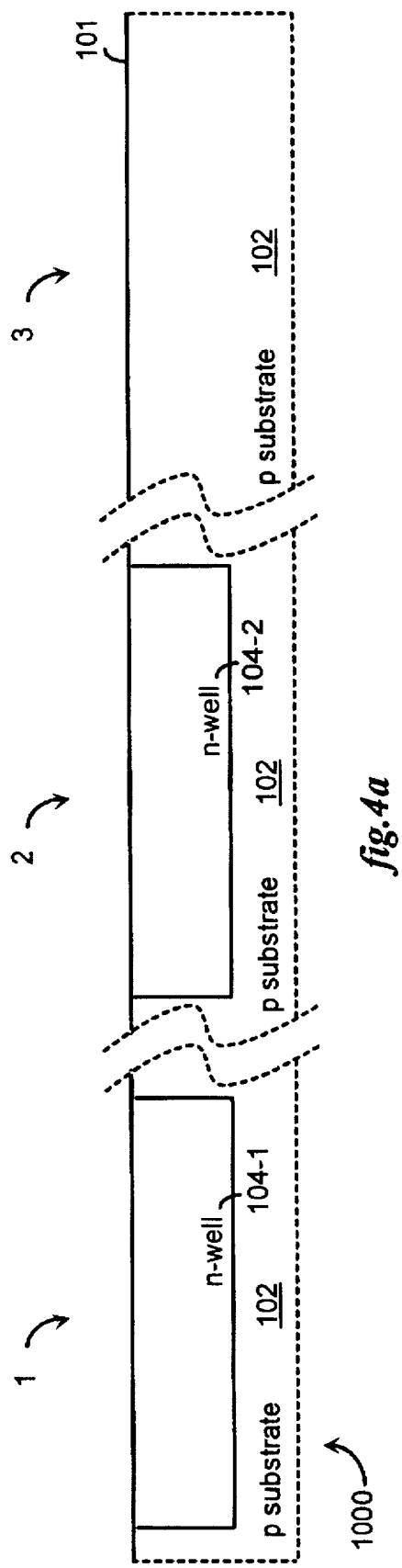

In FIG. 4a, the semiconductor wafer 1000 is shown divided into three regions, 1, 2 and 3, for illustrative purposes. In region 1, the MOS precision capacitor 100 is to be formed; in region 2, the p-mos transistor 200 is to be formed; and in region 3, the n-mos transistor 300 is to be formed. Starting with a p substrate 102, n-wells 104-1 and 104-2 are concurrently formed respectively for the MOS precision capacitor 100 and the p-mos transistor 200 by conventional methods such as, in a same mask step, implanting a n-type dopant into these areas. Since the type of dopant, the implant energy, and the implant dosage used in this step are generally consistent with those used in forming a n-well in a conventional p-mos transistor, this step does not add to the process steps or complexity used in forming a conventional CMOS integrated circuit.

Figure 4B:
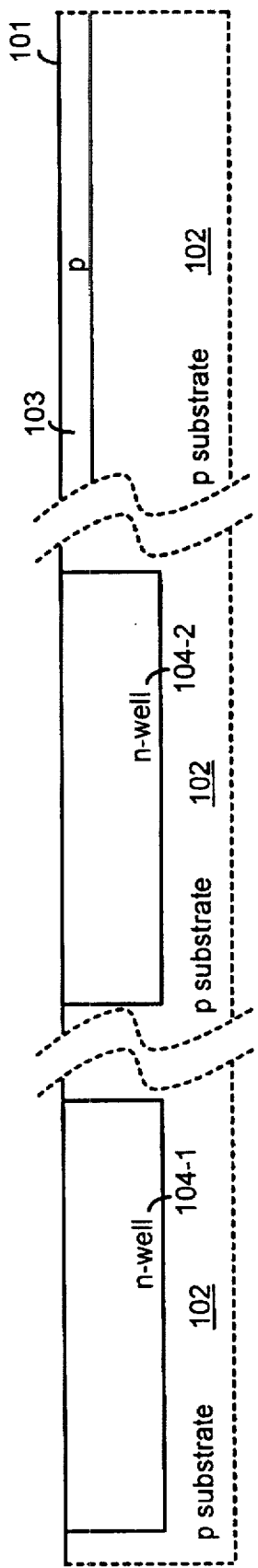

In FIG. 4b, a threshold adjust layer 103 for the n-mos transistor 300 is formed by conventional methods such as selectively implanting an appropriate dopant through a top surface 101 of the p substrate 102. Since the type of dopant, the implant energy, and the implant dosage used in this step are generally consistent with those used in forming a threshold adjust region in a conventional n-mos transistor, this step does riot add to the process steps or complexity used in forming a conventional CMOS integrated circuit, or a NMOS integrated circuit.

Figure 4C:
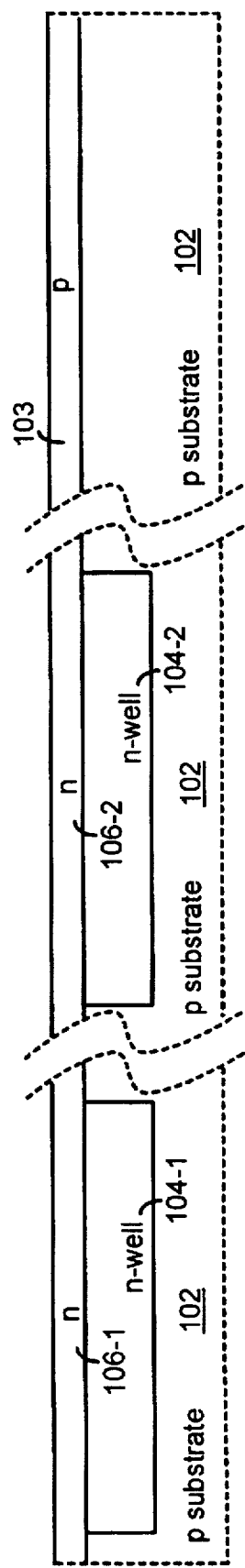

In FIG. 4c, a n-type region 106-1 and a threshold adjust layer 106-2 are concurrently formed respectively in n-wells 104-1 and 104-2 for the MOS precision capacitor 100 and the p-mos transistor 200, by conventional methods such as, in a same mask step, selectively implanting a n-type dopant into these areas. Since the type of dopant, the implant energy, and the implant dosage used in this step are generally consistent with those used in forming a threshold adjust region in a conventional p-mos transistor, this step does not add to the process steps or complexity used in forming a conventional CMOS integrated circuit. Accordingly, the n-type dopant concentration of the n-type region 106-1 is substantially equal to the n-type dopant concentration of the threshold adjust region 106-2 of the p-mos transistor 200. The n-type dopant concentration of the n-type region 106-1 is also preferably approximately within an order of magnitude of the n or p-type dopant concentration of the threshold adjust region 103 of the n-mos transistor 300. By keeping such dopant concentrations substantially equal or at least approximately within an order of magnitude of each other, the thicknesses of the respective gate oxide layers formed over these implanted areas will be substantially equal, thus providing good gate oxide tracking characteristics between the devices.

Figure 4D:
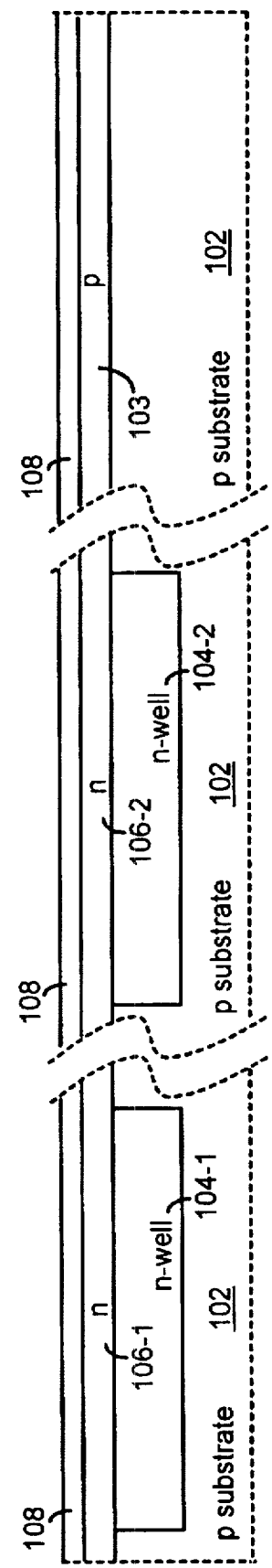

In FIG. 4d, an oxide layer 108 is formed by conventional methods over the exposed top surface 101 of the p substrate 102. Since the material composition and thickness of the oxide layer 108 formed in this step is generally consistent with those of a gate oxide layer formed in conventional p-mos and n-mos transistors, this step does not add to the process steps or complexity used in forming a conventional CMOS integrated circuit. As previously described in reference to FIG. 4c, the thickness of the oxide layer 108 over the n-type region 106-1 of the MOS precision capacitor 100, the thickness of the oxide layer 108 over the threshold adjust region 106-2 of the p-mos transistor 200, and the thickness of the oxide layer 108 over the threshold adjust layer 103 of the n-mos transistor 300 are approximately equal, thereby providing good gate oxide tracking characteristics between the MOS precision capacitor 100, the p-mos transistor 200, and the n-mos transistor 300.

Figure 4E:
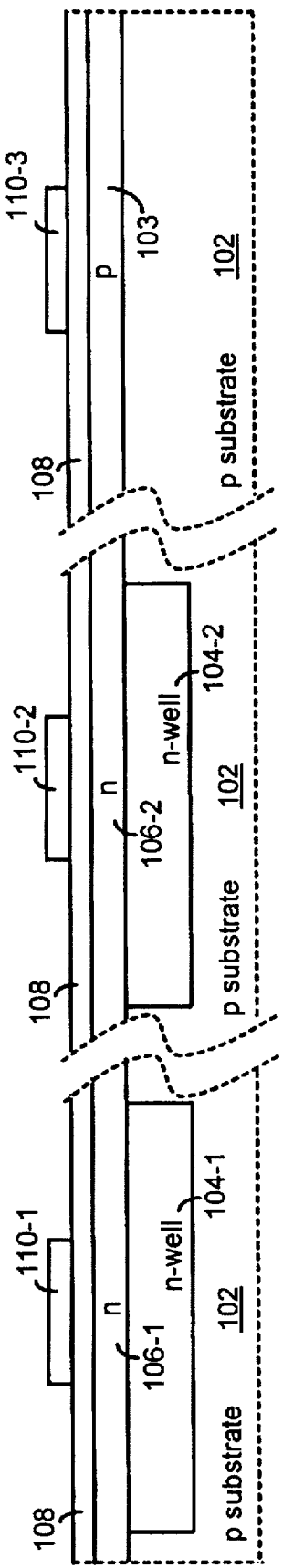

In FIG. 4e, a first electrode 110-1 of the MOS precision capacitor 100, a gate electrode 110-2 of the p-mos transistor 200, and a gate electrode 110-3 of the n-mos transistor 300 are formed by conventional methods over the oxide layer 108. Since the material composition and thickness of the first electrode 110-1 of the MOS precision capacitor 100, the gate electrode 110-2 of the p-mos transistor 200, and the gate electrode 110-3 of the n-mos transistor 300 formed in this step are generally consistent with those of gate electrodes formed in conventional p-mos and n-mos transistors, this step does not add to the process steps or complexity used in forming a conventional CMOS integrated circuit, or a NMOS integrated circuit.

Figure 4F:
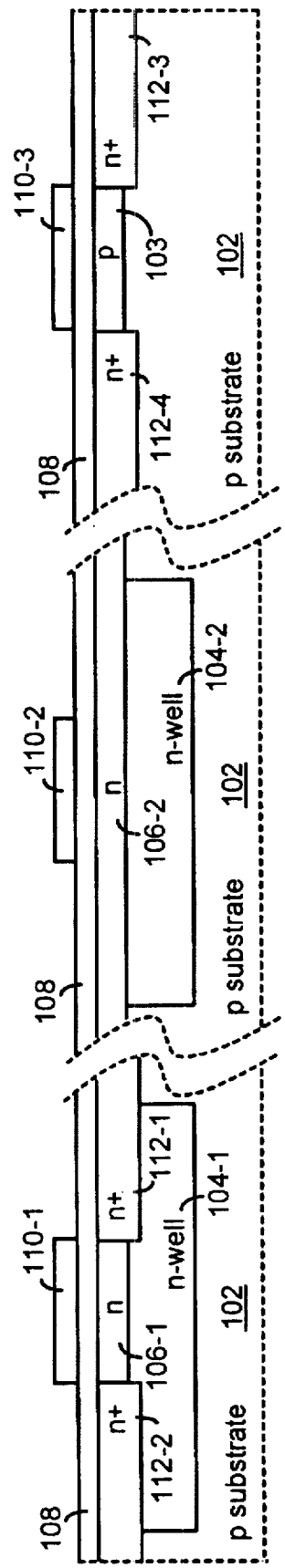

In FIG. 4f, n+ regions 112-1 (optional) and 112-2 and n+ regions 112-3 and 112-4 are concurrently formed, wherein n+ regions 112-1 (optional) and 112-2 are formed for the MOS precision capacitor 100 and n+ regions 112-3 and 112-4 are respectively formed for the source and drain regions of the n-mos transistor 300 by conventional methods such as, in a same mask step, implanting a n-type dopant into these areas. Since the type of dopant, the implant energy, and the implant dosage used in this step are generally consistent with those used in forming n+ source and drain regions in a conventional n-mos transistor, this step does not add to the process steps or complexity used in forming a conventional CMOS integrated circuit, or a NMOS integrated circuit.

In FIG. 4g, p+ regions 113-1 and 113-2 are formed for the drain and source regions of the p-mos transistor 200 by conventional methods such as, in a same mask step, implanting a p-type dopant into these areas. Since this step is not required for forming the MOS precision capacitor 100, it does not add to the process steps or complexity used in forming a conventional CMOS integrated circuit. Further, it is a step that would not be necessary in forming a NMOS integrated circuit.

In FIG. 4h, the MOS precision capacitor 100, the p-mos transistor 200, and the n-mos transistor 300 are shown as being substantially formed. In particular, a second electrode 116-1 of the MOS precision capacitor 100 is formed by conventional methods to make contact to the n+ region 112-2 of the MOS precision capacitor 100, drain and source electrodes 116-3 and 116-2 of the p-mos transistor 200 are formed by conventional methods to respectively make contact to the p+ drain and source regions 113-1 and 113-2 of the p-mos transistor 200, and source and drain electrodes 116-5 and 116-4 of the n-mos transistor 300 are formed by conventional methods to respectively make contact to the n+ source and drain regions 112-5 and 112-4 of the n-mos transistor 300. Since the material of the second electrode 116-1 of the MOS precision capacitor 100, the drain and source electrodes 116-3 and 116-2 of the p-mos transistor 200, and the source and drain electrodes 116-5 and 116-4 of the n-mos transistor 300 formed in this step are generally consistent with those of source and drain electrodes formed in conventional p-mos and n-mos transistors, this step does not add to the process steps or complexity used in forming a conventional CMOS integrated circuit, or a NMOS integrated circuit.

Although FIGS. 4a–4h illustrate, as an example, the forming of a MOS precision capacitor 100 along with representative p-mos and n-mos transistors, 200 and 300, in a conventional CMOS integrated circuit, numerous variations to the structures and steps described in reference to the figures are also contemplated to be within the full scope of the present invention. As one example, although the MOS precision capacitor 100 is described as being formed on a p substrate 102 of a semiconductor wafer 1000, it is to be appreciated that aspects of the present invention are also applicable to forming a MOS precision capacitor on a n substrate. As another example, although the MOS precision capacitor 100 is described as being formed in a CMOS integrated circuit, it is to be appreciated that aspects of the present invention are also applicable to forming a MOS precision capacitor in a NMOS integrated circuit or a PMOS integrated circuit. As yet another example, FIG. 5 illustrates a MOS precision capacitor 100' formed in a n-well 104' shared with p-mos transistor 200' with a field oxide region 500 electrically isolating the two devices. Such a construction is especially convenient where precision capacitors are to be connected to p-mos transistors in an integrated circuit, but would be, on the other hand, inconvenient where precision capacitors are to be connected to n-mos transistors in the integrated circuit.

As still another example, FIG. 6 illustrates a MOS precision capacitor 100" including n-type regions 111-1, 112-1, 111-2, and 112-2 formed concurrently with corresponding regions 111-3, 112-3, 111-4, and 112-4 forming conventional lightly doped source and drain regions of a n-mos transistor 300". To form the lightly doped drain ("LDD") regions of the MOS precision capacitor 100" and the n-mos transistor 300", n-regions 111-1 and 111-2 of the MOS precision capacitor 100" and n-regions 111-3 and 111-4 of the n-mos transistor 300" are first concurrently formed by conventional self aligning methods such as, in a same mask step, implanting a n-type dopant into these areas after formation of the first electrode 110-1 of the MOS precision capacitor 100", the gate electrode 110-2 of the p-mos transistor 200, and the gate electrode of the n-mos transistor 300". Since the type of dopant, the implant energy, and the implant dosage used in forming such n-regions are generally consistent with those used in forming lightly doped drains in conventional LDD transistors, this step does not add to the process steps or complexity used in forming a conventional LDD transistor. Spacers 109-1 and 109-2 attached to sidewalls of the first electrode 110-1 of the MOS precision capacitor 100" are then preferably concurrently formed with spacers 109-3 and 109-4 attached to sidewalls of the gate electrode 110-3 of the n-mos transistor by conventional methods. Since the material and widths of the sidewall spacers formed on the first electrode 110-1 of the MOS precision capacitor 100" and the gate electrode 110-3 of the n-mos transistor are generally consistent with spacers used in forming LDD transistors, the formation of such spacers does not add to the process steps or complexity used in forming a conventional CMOS integrated circuit including LDD transistors. To complete the LDD regions of the MOS precision capacitor 100" and the n-mos transistor 300", n+ regions 112-1 and 112-2 of the MOS precision capacitor 100" and n+ regions 112-3 and 112-4 of the n-mos transistor 300" are then concurrently formed by conventional self aligning methods such as, in a same mask step, implanting a n-type dopant into these areas after formation of spacers 109-1 and 109-2 on the first electrode 110-1 of the MOS precision capacitor 100", and spacers 109-3 and 109-4 on the gate electrode of the n-mos transistor 300". Since the type of dopant, the implant energy, and the implant dosage used in this step are generally consistent with those used in forming n+ source and drain regions in a conventional LDD transistor, this step does not add to the process steps or complexity used in forming a conventional CMOS integrated circuit including LDD transistors.

Figure 7A:
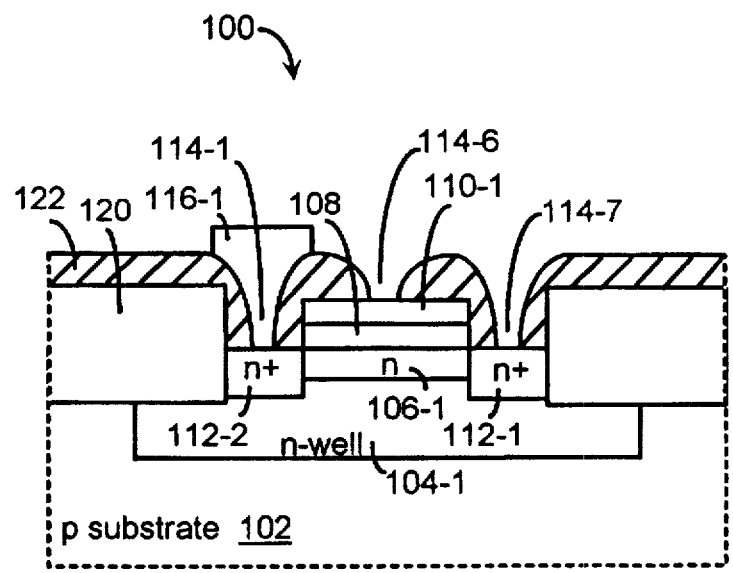
FIGS. 7a–7b respectively illustrate, as examples, MOS precision capacitor structures utilizing aspects of the present invention and corresponding to the integrated circuit structures of FIG. 4h and FIG. 6.
Figure 7B:
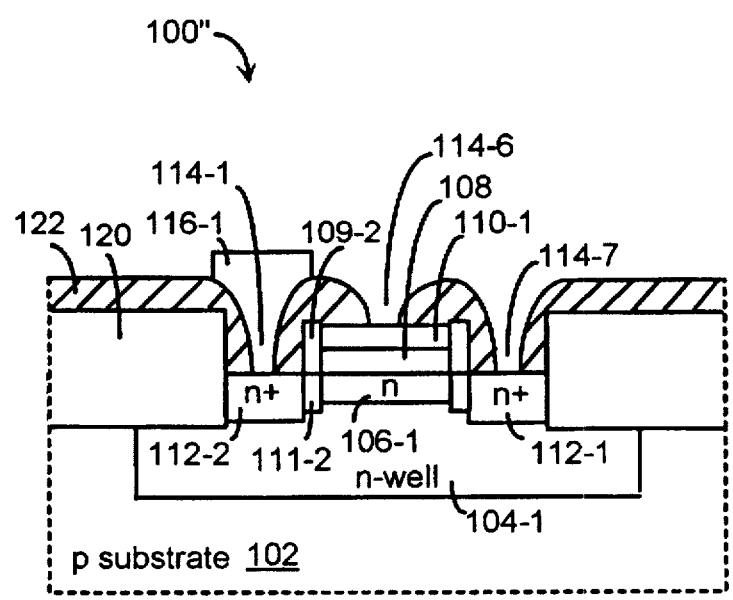

FIGS. 7a and 7b respectively illustrate, as examples, more detailed cross-sectional views of the MOS precision capacitor 100 and the MOS precision capacitor 100". Referring first to FIG. 7a, the MOS precision capacitor 100 is formed in a p substrate 102 having a p-type dopant concentration of $\approx 10^{15}$ cm$^{-3}$. Forming the MOS precision capacitor 100 are a n-well 104-1 formed in the p substrate 102, a n region 106-1 formed in the n-well 104-1, an oxide layer 108 formed over the n region 106-1, a first electrode 110-1 formed over the oxide layer 108, n+ regions 112-1 (optional) and 112-2 formed in the n-well 104-1 by self aligning to the sidewalls of the first electrode 110-1, and a second electrode 116-1 connected to the n+ region 112-2 through a conventionally formed via 114-1 in a conventionally formed top oxide layer 122. Also shown in FIG. 7a, is a conventionally formed field oxide layer 120. Whereas the top oxide layer 122 generally isolates two sandwiching layers of the MOS precision capacitor 100 from each other, the field oxide layer 120 isolates the MOS precision capacitor 100 from other devices formed in the p substrate 102.

In this example, the n-well 104-1 is $\approx 2.5$ μm deep and has a n-type dopant concentration of $\approx 1.0$–$2.0\times10^{16}$ cm$^{-3}$; the n region 106-1 is $\approx 0.1$ μm deep and has a n-type dopant concentration of $\approx 5.0\times10^{16}$ cm$^{-3}$; and the n+ regions 112-1 (optional) and 112-1 are $\approx 0.2$ μm deep and have a n-type dopant concentration of $\approx 1.0\times10^{20}$ cm$^{-3}$. Since the threshold adjust region 106-2 of the p-mos transistor 200 is formed concurrently with the n region 106-1, the threshold adjust region 106-2 of the p-mos transistor 200 is also $\approx 0.1$ μm deep and has a n-type dopant concentration of $\approx 5.0\times10^{16}$ cm$^{-3}$. The dopant concentration of the threshold adjust region 103 of the n-mos transistor 300 is only restricted to preferably being approximately within an order of magnitude of the dopant concentration of the n region 106-1.

Since the dopant concentration in the n region 106-1 is greater than the dopant concentration in the n-well 104-1, the capacitance of the MOS precision capacitor 100 is relatively voltage independent (i.e., has a low voltage coefficient). Also, since the dopant concentration in the n+ regions 112-1 (optional) and 112-2 are greater than the n region 106-1 and significantly greater than the n-well 104-1, the MOS precision capacitor 100 exhibits low signal frequency dependency. In addition, since the MOS precision capacitor 100 is preferably formed in its own n-well 104-1, the MOS precision capacitor 100 is electrically isolated by its n-well 104-1 from "ground bounce" or noise generated by digital circuitry, such as p-mos and n-mos transistors 200 and 300, switching on and off. Further, since the dopant concentrations of the n region 106-1 of the MOS precision capacitor 100, the threshold adjust region 106-2 of the p-mos transistor 200, and the threshold adjust region 103 of the n-mos transistor 300 are approximately within an order of magnitude of each other, the oxide layer 108 formed over these regions is approximately the same thickness and consequently, the capacitances associated with the MOS precision capacitor 100, the p-mos transistor 200, and the n-mos transistor 300 track each other with changes in gate oxide thickness due to manufacturing variances from lot to lot or wafer to wafer.

Referring now to FIG. 7b, the MOS precision capacitor 100" is preferably similarly constructed to the MOS precision capacitor 100 except for the additions of lightly doped regions such as 111-2 formed between n+ region 112-2 and n region 106-1, and spacers such as 109-2 formed on the sidewalls of the first electrode 110-1. As described in reference to FIG. 6, the n-type dopant concentrations of the n+ region 112-1 and its adjacent lightly doped n– region 111-2 are respectively formed concurrently with their corresponding counterparts of the lightly doped drain regions of the n-mos transistor 300" and accordingly, are of a dopant concentration generally used in conventional LDD transistors. Oxide layers 106-1, 120, and 122 are also of a composition and thickness as generally used in conventional transistors.

Figure 8:
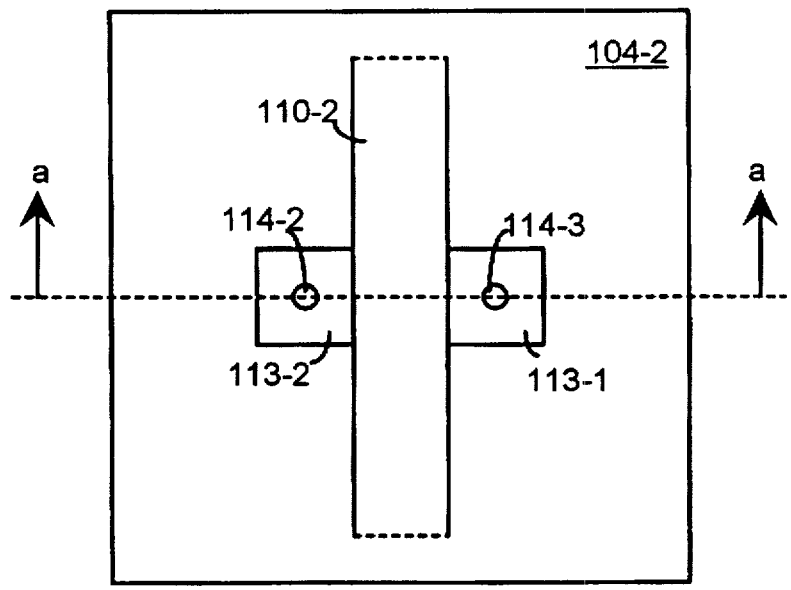
FIGS. 8–9 respectively illustrate, as examples, simplified top plan views of the p-mos transistor depicted in FIG. 4h, and the MOS precision capacitor depicted in FIG. 4h, utilizing aspects of the present invention.
Figure 9:
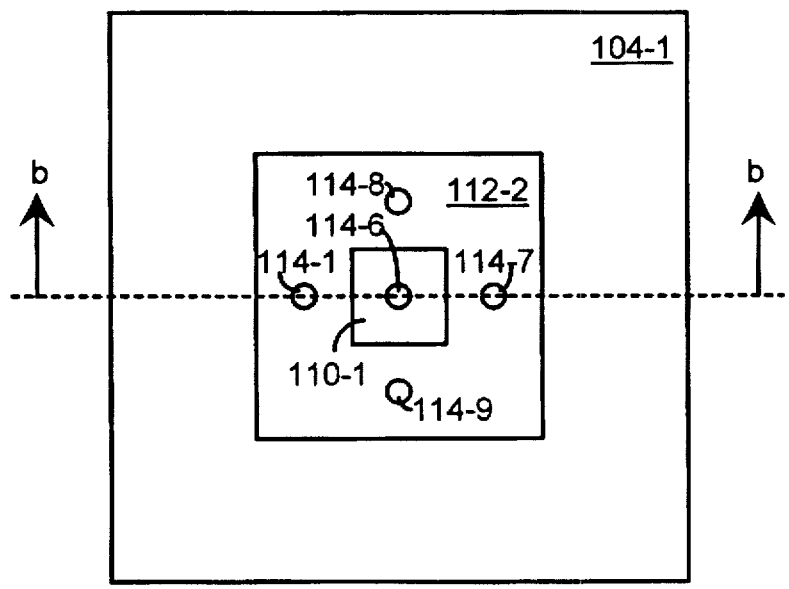

FIGS. 8 and 9 respectively illustrate, as examples, simplified plan views of the p-mos transistor 200 and the MOS precision capacitor 100, wherein cross-sectional cut-outs indicated by arrows marked "a" and "b" respectively correspond to cross-sectional views of the p-mos transistor 200 and the MOS precision capacitor 100, as depicted, for example, in FIG. 4h. Referring first to FIG. 8, the p-mos transistor 200 is depicted as being of conventional layout and construction, having a n-well 104-2, source and drain regions, 113-2 and 113-1, and a polysilicon gate electrode 110-2. To electrically insulate the n-well 104-2, the source and drain regions, 113-2 and 113-1, and the gate electrode 110-2, from metal interconnect layers (not shown), a top oxide layer (not shown) of a material such as BPSG is formed over the n-well 104-2, the source and drain regions, 113-2 and 113-1, and the gate electrode 110-2. Electrical connection to the source and drain regions, 113-2 and 113-1, is made by conventional means such as vias, 114-2 and 114-3, formed in the top oxide layer (not shown). A field oxide (e.g., 500 in FIG. 5) of a material such as SiO$_2$ is conventionally formed around the p-mos transistor 200 to isolate it from charge carriers generated by other devices formed on the same p substrate as the p-mos transistor 200.

Referring now to FIG. 9, the MOS precision capacitor 100 is shown to include a n-well 104-1, a first electrode 110-1 formed above the n-well 104-1, and a n+ region 112-2 formed in the n-well 104-1 and surrounding the first electrode 110-1. Preferably, the first electrode 110-1 comprises a polysilicon material such as conventionally used for forming the gates of p-mos and n-mos transistors such as 200 and 300. A top oxide layer 122 (FIG. 7a) is formed over the n-well 104-1, the first electrode 110-1, and the n+ region 112-2 to insulate them from metal interconnect layers (not shown), for example, formed over them. At least one via (e.g., 114-1) is formed in the top oxide layer 122 so that an electrical contact (e.g., 116-1) can be formed therein providing a conductive path down to the n+ region 112-2. Preferably, the electrical contact (e.g., 116-1), also referred to herein as the second electrode of the MOS precision capacitor 100, comprises a metal such as used in forming corresponding electrical contacts (not shown) in vias 114-2 and 114-3 of the p-mos transistor 200. Other vias (e.g., 114-7 to 114-9) may also be formed in the top oxide layer around the first electrode 110-1, which have electrical contacts (not shown) formed in them to even the current distribution flowing in the MOS precision capacitor 100. In addition, at least one via (e.g., 114-6) is preferably formed in the top oxide layer 122 so that an electrical contact (not shown) can be formed therein providing a conductive path down to the first electrode 110-1. As depicted in FIG. 9, the n+ region 112-2 surrounds (like a moat) the first electrode 110-1. In this case, n+ regions 112-1 and 112-2 as depicted in FIGS. 4h and 7b, are actually the same region.

Although the various aspects of the present invention have been described with respect to a preferred embodiment, it will be understood that the invention is entitled to full protection within the full scope of the appended claims.

What is claimed is:

1. A method of forming a precision capacitor in an integrated circuit including a p-mos transistor and a complementary n-mos transistor, wherein said precision capacitor, said p-mos transistor, and said n-mos transistor are respectively formed in first, second, and third regions of a semiconductor wafer including said integrated circuit, comprising:

forming, in a same mask step, a n-well in said first region where said precision capacitor is to be formed, and a n-well in said second region where said p-mos transistor is to be formed, forming a gate oxide layer covering said first, second, and third regions of said semiconductor wafer, forming a first electrode of said precision capacitor over the gate oxide layer formed over said n-well formed in said first region of said semiconductor wafer, and forming a gate electrode of said n-mos transistor over the gate oxide layer formed over said third region of said semiconductor wafer, forming, in a same mask step, a first n-type region self aligned to said first electrode of said precision capacitor in said n-well formed in said first region of said semiconductor wafer such that said first n-type region has a dopant concentration greater than said n-well formed in said first region, and a second n-type region self aligned to said gate electrode of said n-mos transistor in said third region of said semiconductor wafer such that said second n-type region has a dopant concentration greater than said n-well formed in said third region, and forming a second electrode of said precision capacitor by connecting said second electrode to said first n-type region self aligned to said first electrode of said precision capacitor.

2. The method as recited in claim 1, further comprising forming, in a same mask step performed after said precision capacitor and p-mos transistor n-well forming step and before said gate oxide layer forming step, a third n-type region in said n-well formed in said first region of said semiconductor wafer such that said third n-type region has a dopant concentration less than said first n-type region and greater than said n-well formed in said first region, and a n-type threshold adjust region in said n-well formed in said second region of said semiconductor wafer, wherein said first precision capacitor electrode forming step comprises forming a first electrode of said precision capacitor over the gate oxide layer formed over said third n-type region formed in said n-well formed in said first region of said semiconductor wafer.

3. The method as recited in claim 2, further comprising blanket implanting, before said precision capacitor and p-mos transistor n-well forming step, a dopant into said first, second, and third regions of said semiconductor wafer such that the dopant implanted into said third region acts as a threshold adjust region for said n-mos transistor formed in said third region, and the dopant implanted into said first region has a dopant concentration approximately within an order of magnitude of the dopant concentration in said third n-type region formed in said n-well formed in said first region of said semiconductor wafer.

4. The method as recited in claim 2, further comprising blanket diffusing, before said precision capacitor and p-mos transistor n-well forming step, a dopant into said first, second, and third regions of said semiconductor wafer such that the dopant implanted into said third region acts as a threshold adjust region for said n-mos transistor formed in said third region, and the dopant implanted into said first region has a dopant concentration approximately within an order of magnitude of the dopant concentration in said third n-type region formed in said n-well formed in said first region of said semiconductor wafer.

5. The method as recited in claim 1, wherein said first and second n-type regions forming step comprise:

forming, in a same mask step, a first lightly doped n-type region self aligned to said first electrode of said precision capacitor in said n-well formed in said first region of said semiconductor wafer such that said first lightly doped n-type region has a dopant concentration less than said n-well formed in said first region, and a second lightly doped n-type region self aligned to said gate electrode of said n-mos transistor in said third region of said semiconductor wafer such that said second lightly doped n-type region has a dopant concentration less than said n-well formed in said third region, forming a spacer on said first electrode of said precision capacitor, and a spacer on said gate electrode of said n-mos transistor, and forming, in a same mask step, a first heavily doped n-type region self aligned to said spacer formed on said first electrode of said precision capacitor such that said first heavily doped n-type region has a dopant concentration greater than said n-well formed in said first region, and a second heavily doped n-type region self aligned to said spacer formed on said gate electrode of said n-mos transistor such that said second heavily doped n-type region has a dopant concentration greater than said n-well formed in said third region, wherein said first lightly doped and first heavily doped n-type regions form said first n-type region in said n-well formed in said first region of said semiconductor wafer, and said second lightly doped and second heavily doped n-type regions form said second n-type region formed in said third region of said semiconductor wafer.

6. The method as recited in claim 1, wherein said precision capacitor first electrode and said n-mos transistor gate electrode forming steps comprise forming, in a same mask step, a first electrode of said precision capacitor over the gate oxide layer formed over said n-well formed in said first region of said semiconductor wafer, and forming a gate electrode of said n-mos transistor over the gate oxide layer formed over said third region of said semiconductor wafer.

7. The method as recited in claim 1, wherein said precision capacitor n-well and p-mos transistor n-well forming step comprises forming, during a same ion implantation, a n-well in said first region where said precision capacitor is to be formed, and a n-well in said second region where said p-mos transistor is to be formed.

8. The method as recited in claim 1, wherein said first and second n-type regions forming step comprises forming, during a same ion implantation, a first n-type region self aligned to said first electrode of said precision capacitor in said n-well formed in said first region of said semiconductor wafer such that said first n-type region has a dopant concentration greater than said n-well formed in said first region, and a second n-type region self aligned to said gate electrode of said n-mos transistor in said third region of said semiconductor wafer such that said second n-type region has a dopant concentration greater than said n-well formed in said third region.

9. The method as recited in claim 2, wherein said third n-type region and n-type threshold adjust region forming step comprises forming, during a same ion implantation, a third n-type region in said n-well formed in said first region of said semiconductor wafer such that said third n-type region has a dopant concentration less than said first n-type region and greater than said n-well formed in said first region, and a n-type threshold adjust region in said n-well formed in said second region of said semiconductor wafer, wherein said first precision capacitor electrode forming step comprises forming a first electrode of said precision capacitor over the gate oxide layer formed over said third n-type region formed in said n-well formed in said first region of said semiconductor wafer.

10. The method as recited in claim 5, wherein said first and second lightly doped n-type regions forming step comprises forming, during a same ion implantation, a first lightly doped n-type region self aligned to said first electrode of said precision capacitor in said n-well formed in said first region of said semiconductor wafer such that said first lightly doped n-type region has a dopant concentration less than said n-well formed in said first region, and a second lightly doped n-type region self aligned to said gate electrode of said n-mos transistor in said third region of said semiconductor wafer such that said second lightly doped n-type region has a dopant concentration less than said n-well formed in said third region.

11. The method as recited in claim 5, wherein said first and second heavily doped n-type regions forming step comprises forming, during a same ion implantation, a first heavily doped n-type region self aligned to said spacer formed on said first electrode of said precision capacitor such that said first heavily doped n-type region has a dopant concentration greater than said n-well formed in said first region, and a second heavily doped n-type region self aligned to said spacer formed on said gate electrode of said n-mos transistor such that said second heavily doped n-type region has a dopant concentration greater than said n-well formed in said third region, wherein said first lightly doped and first heavily doped n-type regions form said first n-type region in said n-well formed in said first region of said semiconductor wafer, and said second lightly doped and second heavily doped n-type regions form said second n-type region formed in said third region of said semiconductor wafer.

* * * * *

UNITED STATES PATENT AND TRADEMARK OFFICE
CERTIFICATE OF CORRECTION

PATENT NO. : 5,750,426
DATED : May 12, 1998
INVENTOR(S) : Rajkanan et al.

It is certified that error appears in the above-identified patent and that said Letters Patent is hereby corrected as shown below:

On the Title Page, Section [22] replace:
"Filed: November 24, 1996" with

--Filed: October 24, 1996--

Signed and Sealed this

Fourteenth Day of March, 2000

Attest:

Attesting Officer

Q. TODD DICKINSON

Commissioner of Patents and Trademarks